(12) United States Patent
Moenster et al.

(10) Patent No.: US 8,913,640 B2
(45) Date of Patent: Dec. 16, 2014

(54) SEMICONDUCTOR LASER ASSEMBLY AND METHOD FOR PRODUCING A SEMICONDUCTOR LASER ASSEMBLY

(75) Inventors: Mathias Moenster, Stuttgart (DE); Hans-Jochen Schwarz, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 13/825,273

(22) PCT Filed: Sep. 8, 2011

(86) PCT No.: PCT/EP2011/065549
§ 371 (c)(1),
(2), (4) Date: Jun. 6, 2013

(87) PCT Pub. No.: WO2012/041678
PCT Pub. Date: Apr. 5, 2012

(65) Prior Publication Data
US 2013/0250994 A1 Sep. 26, 2013

(30) Foreign Application Priority Data

Sep. 29, 2010 (DE) .......................... 10 2010 041 598
Nov. 10, 2010 (DE) .......................... 10 2010 043 693

(51) Int. Cl.
| | |
|---|---|
| *H01S 5/00* | (2006.01) |
| *H01S 5/028* | (2006.01) |
| *H01S 5/024* | (2006.01) |
| *H01S 5/022* | (2006.01) |
| *H01S 5/20* | (2006.01) |
| *H01S 5/042* | (2006.01) |

(52) U.S. Cl.
CPC .............. *H01S 5/028* (2013.01); *H01S 5/0286* (2013.01); *H01S 5/02476* (2013.01); *H01S 5/0224* (2013.01); *H01S 5/2031* (2013.01); *H01S 5/02272* (2013.01); *H01S 5/0425* (2013.01); *H01S 5/2022* (2013.01)
USPC ............ 372/43.01; 372/34; 372/50.1; 372/99

(58) Field of Classification Search
CPC ......... H01S 5/00; H01S 5/026; H01S 5/0215; H01S 5/0216; H01S 5/02236; H01S 5/0224; H01S 5/02272; H01S 5/028; H01S 5/0281
USPC ....................................... 372/43.01, 50.1, 99
See application file for complete search history.

(56) References Cited

U.S. PATENT DOCUMENTS

| | | | |
|---|---|---|---|
| 2002/0185699 A1* | 12/2002 | Reid .............................. 257/414 |
| 2004/0195297 A1 | 10/2004 | Powers et al. | |

(Continued)

FOREIGN PATENT DOCUMENTS

| | | | |
|---|---|---|---|
| JP | 02-035788 | * | 2/1990 |
| JP | 101 35 572 | | 5/1998 |

OTHER PUBLICATIONS

International Search Report for PCT/EP2011/065549, dated Jan. 26, 2012.

(Continued)

*Primary Examiner* — Dung Nguyen
(74) *Attorney, Agent, or Firm* — Kenyon & Kenyon LLP (57) ABSTRACT

A semiconductor laser assembly has at least one semiconductor laser which is designed to emit laser radiation through an exit area and at least one further area, the further area being a part of a surface of the semiconductor laser and/or of the semiconductor laser assembly and the further area is developed to be reflecting to the radiation of at least one specifiable wavelength range. For this purpose, a reflecting metal layer is applied, for example. The semiconductor laser having a laser layer is able to be fastened to a carrier element with the aid of a solder layer.

21 Claims, 7 Drawing Sheets

(56) References Cited

U.S. PATENT DOCUMENTS

| | | | |
|---|---|---|---|
| 2008/0101422 A1 | 5/2008 | Ryu et al. | |
| 2008/0102546 A1 | 5/2008 | Ryu et al. | |
| 2012/0147915 A1* | 6/2012 | Perlin et al. | 372/43.01 |
| 2013/0251944 A1* | 9/2013 | Kian et al. | 428/141 |

OTHER PUBLICATIONS

R. Schatz, C.G. Bethea, "Steady state model for facet heating leading to thermal runaway in semiconductor lasers", J. Appl. Phys. 76 (4), 1994, pp. 2509.

Ziegler et al. "Physical limits of semiconductor laser operation: A time-resolved analysis of catastrophic optical damage", Applied Physics Letters 97, 1 (2010).

* cited by examiner

SEMICONDUCTOR LASER ASSEMBLY AND METHOD FOR PRODUCING A SEMICONDUCTOR LASER ASSEMBLY

BACKGROUND OF THE INVENTION

1. Field of the Invention

The present invention relates to a semiconductor laser assembly having at least one semiconductor laser, which is developed to emit laser radiation through an exit area. The present invention also relates to a method for producing such a semiconductor laser assembly.

2. Description of the Related Art

Every laser reacts sensitively when it is struck by back reflections of its own wavelength. The back reflections come about by external optical components, for example. In the most favorable case, an increasing "noise" of the laser intensity is observed, and in the worst case the destruction of an exit area comes about, through which the generated laser radiation leaves the semiconductor laser, and when this happens, no further laser emission is possible.

The exit area (the facet) is destroyed if it becomes locally so hot that the material in the facet area decomposes and melts. In the case of GaAs (gallium arsenide) the melting point is approximately 1238° C., and thermal changes set in beginning at about 300° C. This means that a critical temperature has to be exceeded, which is in the range of about 300° C. to about 1238° C., before the facet is damaged. Because of the thermal changes of the material in the facet area beginning at 300° C., an especially strong absorption takes place there, and the melting temperature is reached within a very short time (<1 μs).

LITERATURE a) R. Schatz, C. G. Bethea, "Steady state model for facet heating leading to thermal runaway in semiconductor lasers", J. Appl. Phys. 76 (4), 1994, pp. 2509
b) Ziegler et al. "Physical limits of semiconductor laser operation: A time-resolved analysis of catastrophic optical damage", Applied Physics Letters 97, 1 (2010)

BRIEF SUMMARY OF THE INVENTION

Accordingly, it is an object of the present invention to improve a semiconductor laser assembly and a production method for this in such a way that cost-effective production and reliable operation of the semiconductor laser assembly may be taken for granted and the abovementioned disadvantages are avoided.

This object is attained for a semiconductor laser assembly of the type named at the outset in that at least one area, that is different from the exit area, of a surface of the semiconductor laser and/or the semiconductor laser assembly is developed to be reflecting for the radiation of at least one specifiable wavelength range, particularly for the laser radiation.

According to investigations by the applicant, advantageously a substantial decrease in the radiation energy irradiated into the semiconductor laser assembly thereby comes about, which may be made up, for example, of reflected laser radiation or other radiation from the surroundings of the semiconductor laser assembly. Particularly advantageously, because of the reflecting development of the present invention, it is effectively avoided that such undesired radiation is irradiated directly into the semiconductor laser, where it is able to interfere with the operation of the semiconductor laser.

Alternatively or supplementarily to a reflectivity for the wavelengths of the generated laser radiation, it may also be provided that one should design reflectingly the reflecting area for other wavelengths or wavelength ranges than the self-generated laser radiation. This may be particularly meaningful if the semiconductor laser assembly is used in a target system which could also emit interfering radiation (such as from the infrared range) to the semiconductor laser. A broadband reflecting development is likewise conceivable. Moreover, it is conceivable to provide reflecting surface areas which respectively operate in different wavelength ranges, the wavelength ranges also not having to be adjacent to one another.

In a particularly preferred manner, the wavelength range, for which the at least one surface area is developed in a reflecting manner, according to one specific embodiment, covers approximately 200 nanometers to about 1800 nanometers, especially approximately 800 nanometers to about 1080 nanometers. Additional specific embodiments have at least one reflecting surface area, which is developed reflectingly for at least one of the following wavelengths: 808 nm, 880 nm, 946 nm, 1030 nm, 1064 nm, 1080 nm.

In the case of an additional particularly advantageous specific embodiment of the semiconductor laser assembly according to the present invention, it is provided that a reflectivity of the at least one reflecting area be about 50% greater, preferably about 90% greater.

In one particularly advantageous specific embodiment of the semiconductor arrangement according to the present invention, it is provided that an area, situated adjacent to the exit area, of the surface of the semiconductor laser and or the semiconductor laser assembly be developed in a reflecting manner. By doing this, one may advantageously reduce the heat input in the area of the exit area of the semiconductor laser by radiation entering from the surroundings into the semiconductor laser or the semiconductor laser assembly, so that the operating temperature of the exit area of the semiconductor laser may be held to lower values in comparison to conventional systems. Particularly in the case of semiconductor lasers having high output power the risk is thereby advantageously avoided that thermal defects in the range of the exit area, i.e. the laser facet, are created.

In one further advantageous specific embodiment it is provided that an end face of a substrate layer of the semiconductor laser is developed to be reflecting, whereby a particularly effective protection of the semiconductor laser assembly from the undesired application of radiation into the semiconductor arrangement exists. This variant of the invention may be particularly efficiently used in semiconductor laser assemblies which have edge emitting semiconductor lasers, in which the exit area of the laser radiation is consequently also located on the end face of the semiconductor laser assembly.

One specific embodiment of the present invention, that is of especially low cost from a standpoint of production engineering, provides that the at least one area have a metallic and/or dielectric reflector layer. Such a reflector layer may advantageously be produced, or applied onto the semiconductor laser assembly, to the greatest extent by using conventional, well-tested semiconductor production methods. The combination of metallic and dielectric reflector layers is also conceivable.

In one additional advantageous specific embodiment it is provided that the reflector layer is made of metal, particularly of gold, and that the thickness of the reflector layer is greater than about 40 nanometers, preferably greater than 80 nanometers. According to the present invention, it has been recognized that such a layer thickness for the reflector layer has the effect of a particularly efficient reflection of undesired radiation. For instance, a metallic reflector layer made of gold, having a layer thickness of about 50 nanometers reflects already 97% of the radiation energy of the undesired radiation (with reference to a wavelength of the radiation to be reflected of about 808 nanometers).

However, greater layer thicknesses of the metallic reflector layers may also be used so that, in addition to the reflector function, improved thermal conduction in the area of the reflector layer is a fact. An undesired heat input in the area of the exit area of the semiconductor laser may thereby be additionally reduced, because the heat is advantageously conducted away by the metallic reflector layer.

In one particularly advantageous manner, the reflector layer according to the present invention is brought as near as possible to the area of the exit area, so that as little as possible of the surface of the semiconductor laser assembly, that is exposed to undesired radiation, remains. It is true, though, that the exit area of the semiconductor laser should not be acted upon by the metallic and/or the electrical reflection layer, so as not to impair the beam quality of the laser radiation that is generated.

Alternatively or supplementarily to the use of gold to develop the metallic reflector layers, other suitable metals could also be used, such as silver, aluminum or the like. Combination with a Ti (titanium) layer and/or a Pt (platinum) layer is also conceivable. The production of dielectric reflector layers takes place in a manner known per se, for instance by applying Bragg mirrors which are able to be produced using silicon compounds or titanium compounds, particularly using silicon, silicon oxide, silicon nitride, titanium oxide, tantalum oxide or other known dielectrics. A combination of the abovementioned materials may also be used.

In a further advantageous exemplary embodiment it is provided that the semiconductor laser be situated on a carrier element using a solder layer, and that the distance of the solder layer from the exit area be less than 20 μm (micrometers), preferably less than 10 μm. This variant of the present invention represents a further advantageous measure for the improved heat dissipation from the region of the exit area of the semiconductor laser. In a particularly preferred manner, the solder layer, which connects the semiconductor laser to the carrier element, should be developed so that maximum wetting of the semiconductor laser takes place. In this case, as great as possible a heat dissipation is able to be implemented from the region of the exit area of the semiconductor laser.

In one further advantageous exemplary embodiment, it is provided that between one laser layer having at least one active zone and a substrate layer of the semiconductor laser an intermediate layer is situated, which is at least partially developed to be transparent to radiation of a specifiable wavelength range, especially to the laser radiation.

The transparent intermediate layer advantageously enables the conducting on of radiation that is undesired per se, and is incident upon the semiconductor laser assembly, so that this radiation, using the intermediate layer, is advantageously conducted away from the region of the exit area of the semiconductor laser, for example, into farther inside regions of the semiconductor laser assembly. This, in turn, advantageously ensures that the undesired radiation, which strikes the semiconductor laser assembly, is not directly converted into heat in an area of the substrate which is situated directly adjacent to the exit area of the semiconductor laser.

A further advantage of the intermediate layer, according to the present invention, is that the intermediate layer, or rather its end face, in the stack construction including the semiconductor laser, the intermediate layer and the substrate layer, as it were, represents a buffer for the application of the metallic reflector layer or the dielectric reflector layer. Based on the presence of the intermediate layer between the semiconductor laser and the substrate layer, to be precise, the application of the reflector layer onto the substrate layer is able to take place in such a way that the reflector layer at least partially overlaps an end face of the intermediate layer, whereby as great as possible a covering of the substrate surface by the reflector layer is ensured. At the same time, the area of the end face of the intermediate layer remaining free is able to manage the conducting on of the incident radiation. Depending on the thickness of the intermediate layer, the latter advantageously offers a tolerance compensation for the accuracy in applying the reflector layer, because the covering of the end face of the intermediate layer takes place with tolerances, whereas covering the exit area of the semiconductor laser absolutely has to be avoided.

One intermediate layer that is transparent, for example, to radiation having a wavelength of 808 nanometers, may be ensured, for instance, by using aluminum gallium arsenide (AlGaAs), in which the proportion of aluminum is ≥0.3.

Especially advantageously, according to an additional specific embodiment, the intermediate layer may also be developed as a waveguide layer, whereby an even more efficient conducting on of radiation comes about that is incident upon the semiconductor laser assembly, away from a surface area of the exit area. A waveguide layer may be developed, in a manner known per se, in that the intermediate layer, on its part, has a layer construction made up of two partial layers, each having a different index of refraction, the radiation to be guided on being guided in the partial layer having the higher index of refraction.

Similarly to the intermediate layer, the dielectric reflector layer should preferably be developed so that it is adapted to the wavelengths to be transmitted or reflected, whereas the metallic reflector layer, in a manner known per se, is relatively broadband, i.e. is reflecting for large wavelength ranges.

In one additional specific embodiment, it is provided that at least one reflecting area of the semiconductor laser assembly is formed by having one reflector element be provided on the semiconductor laser assembly. Alternatively or supplementarily to the application of a reflecting layer, for instance, by sputtering directly onto a surface of the semiconductor laser assembly, a reflecting surface area is also able to be implemented. The reflector element may, for instance, be a metal foil or another type of formable article made of metal or having a material that reflects well the undesired radiation, and is situated on the semiconductor laser assembly and connected to it in such a way that the semiconductor laser assembly is protected from the undesired radiation, following the principle according to the present invention. Consequently, the reflector element is used, so to speak, to shade the semiconductor laser assembly from the undesired radiation.

A method according to the present invention is characterized by the following steps:
providing at least one semiconductor laser, covering the exit area of the at least one semiconductor laser using a protective mask, applying a reflector layer that reflects the laser radiation onto at least one area, that is different from the exit area, of the semiconductor laser and/or the semiconductor laser assembly, removing the protective mask.

The provision, according to the present invention, of a protective mask makes possible the use of particularly efficient production techniques for applying reflector layers, such as sputtering, while at the same time as great as possible a protection of the sensitive exit area of the semiconductor laser from the gold ions applied during sputtering exists.

In one particularly preferred method variant, it is provided that the covering takes place in that the at least one semiconductor laser is situated on the carrier element forming the protective mask, and is aligned to the carrier element in such a way that the exit area is covered by a section of the carrier element. The carrier element may be developed, for example, tub-shaped or L-shaped, where a leg of the structure of the carrier element is able to be used as a protective mask for the exit area of a semiconductor laser.

BRIEF DESCRIPTION OF THE DRAWINGS

FIG. 6a shows a side view of a plurality of semiconductor laser assemblies, according to the present invention, during a production step according to a specific embodiment according to the present invention.

FIG. 6b shows schematically a detailed view of the configuration in FIG. 6a.

DETAILED DESCRIPTION OF THE INVENTION

Figure 1A:
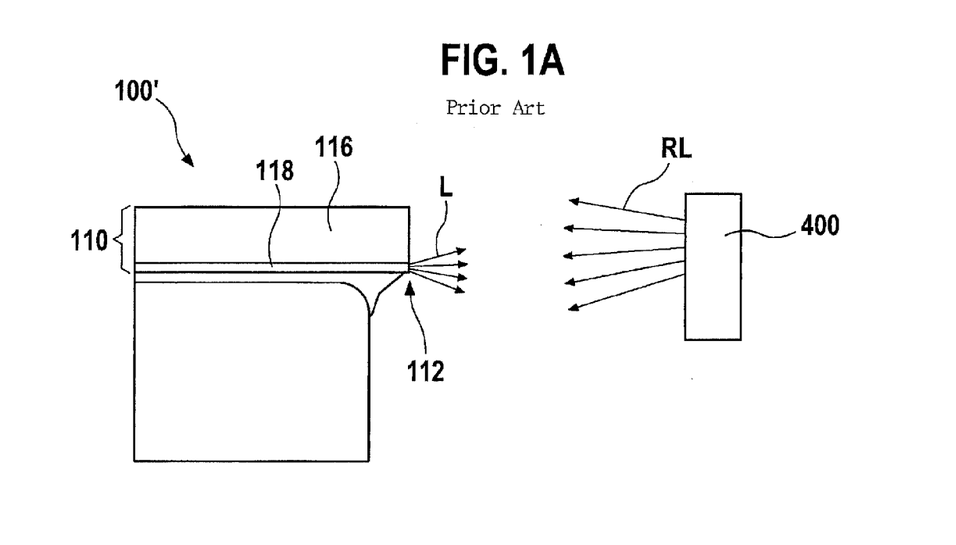
FIG. 1a schematically shows a side view of a semiconductor laser assembly according to the related art.

FIG. 1a schematically shows a side view of a semiconductor laser assembly 100' according to the related art. Semiconductor laser assembly 100' has a substrate 116 (of gallium arsenide, GaAs, for example) as well as a laser layer 118, which may be developed as an epitaxial layer, for example, and has at least one wave guide layer (not illustrated) in a manner known to one skilled in the art, for guiding generated laser radiation, and one or more active zones. The active zones may be formed, for example, by quantum films. The layer construction 116, 118 is designated below as semiconductor laser 110.

Semiconductor laser 110, which is presently developed as an edge emitter, generates laser radiation L, which is eradiated, as may be seen in FIG. 1a, through end face exit area 112. At objects 400 located in the surroundings of semiconductor laser assembly 100', a part of laser radiation L is reflected, for example, and, as reflected laser radiation RL, impinges anew on semiconductor laser assembly 100', which leads to an undesired interaction of the reflected laser radiation RL with semiconductor laser assembly 100'. The undesired interaction includes, among other things, the absorption of irradiated, reflected radiation RL in semiconductor laser assembly 100', particularly in substrate 116, and the heating, going along with this, of the irradiated areas of semiconductor laser assembly 100'.

The heating of substrate 116 turns out to be particularly great if a substrate 116 is used which, based on the spectral position of its band gap, absorbs laser radiation L, RL generated by semiconductor laser assembly 100'. In other words, the heating of substrate 116 is particularly great if the wavelength corresponding to the band gap is greater than the wavelength of laser radiation L, RL. In this case, reflected laser radiation RL is completely absorbed after entering substrate 116, already at a slight depth of entry, so that localized heat is created at the substrate surface, which is able to contribute to the heating of exit area 112 of semiconductor laser assembly 100'. Thus, for example, the band gap of GaAs amounts to 1.42 eV, whereas the wavelength corresponding to the band gap is 870 nm in this case. Accordingly, laser radiation L, RL having wavelengths less than 870 nm is absorbed in GaAs, as is the case particularly in response to widespread laser wavelength 808 nm.

Figure 1B:
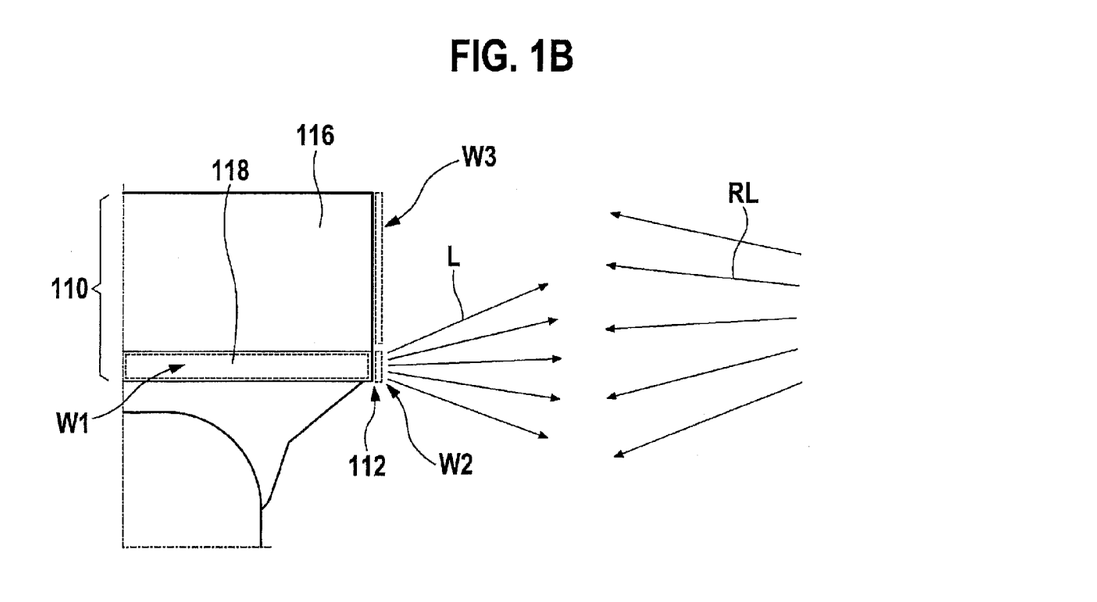
FIG. 1b shows a detailed view of the semiconductor laser assembly of FIG. 1a characterizing regions showing heat sources.

FIG. 1b shows a detailed view of the semiconductor laser assembly of FIG. 1a having a particular characterization of regions W1, W2, W3 representing heat sources which contribute disadvantageously to the heating of exit area 112. There are at least three significant heat sources W1, W2, W3 in the region of exit area 112:

1. Current for operating semiconductor laser 110, and radiation generated hereby, especially laser radiation, heats up laser layer 118, cf. region W1. Exit area 112 also warms up because of heat diffusion.

2. A small part of exiting light L is absorbed at the semiconductor border surface (exit area 112). This is able to increase significantly the temperature of exit area 112, particularly at places having high local intensities, cf. region W2.

3. Back reflected light RL is absorbed in substrate 116. In a development of substrate 116 from GaAs and a wavelength of radiation RL of 808 nm (nanometers), the absorption is particularly strong. Since the absorption takes place predominantly within the first micrometer along the direction of irradiation, cf. region W3, the substrate surface exposed to radiation RL heats up significantly even at low light powers. Exit area 112 also warms up eventually because of heat diffusion.

The sum of the heat inputs from regions W1, W2, W3 is able to drive the temperature at exit area 112 to a critical range. It is the object of the present invention particularly to reduce the heat input at the substrate surface.

To avoid the abovementioned disadvantages, it is provided, according to the present invention, that at least one area, different from exit area 112, of the surface of semiconductor laser 110 and/or of semiconductor laser assembly 100 be developed to be reflecting of laser radiation L and RL. In this way it is able to be advantageously avoided that a heat input into semiconductor laser assembly 100 takes place because of radiation L, RL, cf. particularly regions W3 in FIG. 1b.

Figure 2:
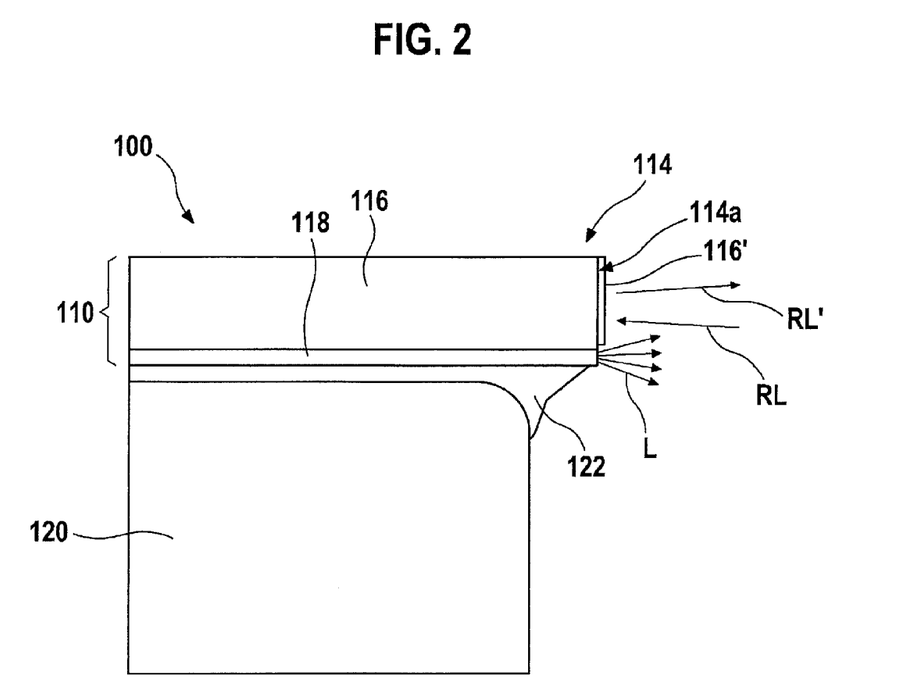
FIG. 2 shows schematically, a side view of a first specific embodiment of a semiconductor laser assembly according to the present invention.

On this point, FIG. 2 shows a side view of a first specific embodiment of semiconductor laser assembly 100 according to the present invention. The layer construction of semiconductor laser 110 corresponds to that of known system 100 in FIG. 1.

However, in contrast to conventional system 100', semiconductor laser assembly 100 according to FIG. 2 has a reflector layer 116', which covers a surface area 114a of surface 114 of semiconductor laser assembly 100. In the present exemplary embodiment, essentially entire end face 114a of substrate 116 of semiconductor laser assembly 100 is covered by reflecting layer 116', so that incident radiation, which may again be reflected laser radiation RL, is advantageously reflected, cf. reference symbol RL'. Because of reflecting layer 116', it may advantageously be avoided that reflected radiation RL or another one is able to contribute incident radiation onto semiconductor laser assembly 100 to heat it up. Reliable operation of semiconductor laser assembly 100 is thereby ensured.

Alternatively or supplementarily to a reflectivity for the wavelengths of generated laser radiation L, it may also be provided that one should design reflecting area 116 for other wavelengths than self-generated laser radiation L. This may be particularly meaningful if semiconductor laser assembly 100 is used in a target system which could also emit interfering radiation (such as from the infrared range) onto semiconductor laser 110. A broadband reflecting development is likewise conceivable.

In the present specific embodiment, semiconductor laser 110 is connected to a carrier element 120 via a solder layer 122.

On laser layer 118 one may advantageously apply a metallization (not shown), in order to make possible a continuous material connection to solder layer 122. A vertical layer thickness of this metallization layer in FIG. 2 is preferably designed to be comparatively large, in order to contribute to an efficient heat dissipation from the area of exit area 112. The layer thickness of the metallization layer, according to one advantageous specific embodiment, amounts to approximately between 0.1 μm and about 2.0 μm, especially between about 0.3 μm and about 1.0 μm.

Figure 3:
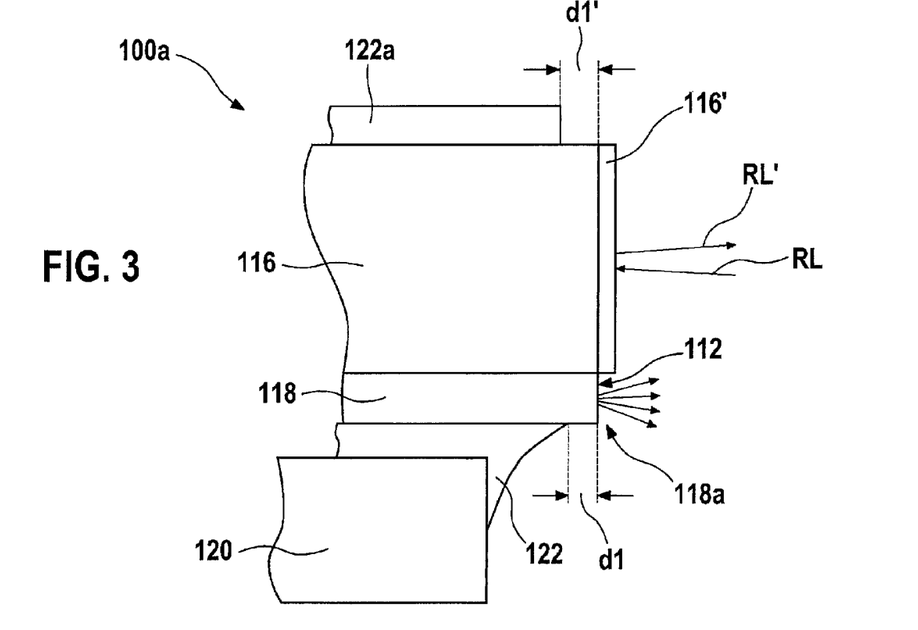
FIGS. 3 to 5 show in each case additional specific embodiments of a laser device according to the present invention.

FIG. 3 shows an additional specific embodiment 100a of the semiconductor laser assembly according to the present invention, only one end region of the stack system being shown enlarged.

According to the present invention, in this specific embodiment 110a, solder layer 122 is applied or situated between carrier element 120 and laser layer 118 in such a way that the distance d1 between solder layer 122 and end face end 118a of laser layer 118, which has exit area 112, is less than about 20 μm, preferably less than 10 μm.

Because of this essentially complete wetting of the underside of laser layer 118 with solder layer 122, this advantageously yields an optimized heat dissipation from right end region 118a of laser layer 118 in FIG. 3, so that exit area 112 is protected from unnecessarily high operating temperatures.

The development of solder layer 122 described above thus contributes in a supplementary manner to the provision of reflecting layer 116' for tempering semiconductor laser 110. In particular, heat is efficiently conducted away from the area of exit area 110, so that the danger of thermally conditioned defects of exit area 112 is minimized.

Following one specific embodiment, reflecting layer 116' may be developed as a metallic layer and include a gold layer, for example. The use of other metals, such as silver or aluminum is also conceivable. Metallic reflector layer 116' is preferably applied by sputtering onto the respective areas 114a (FIG. 2) of semiconductor laser assembly 100, 100a and implements a relatively broadband reflection effect. That is, large wavelength ranges of incident radiation are efficiently reflected.

As a result of investigations by the applicant, it turns out that there is efficient reflection of incident radiation RL on reflecting layer 116 already at layer thicknesses of about 40 nanometers (reflector layer made of gold, reflected radiation RL' having a wavelength of about 808 nanometers.

In one further specific embodiment, heat conducting means 122a may also be provided on a side of substrate 116 facing away from laser layer 118, in order to effect even more efficient cooling, especially of exit area 112. Heat conducting means 122a may be developed as a solder layer, for instance, or as a metallization applied on substrate 116. Particularly preferred, heat conducting means 122a are situated in such a way relative to an end face of system 100 that a distance d1 between heat conducting means 122a and the end face having exit area 112 is equal to or less than about 50 μm, particularly less than 20 μm.

Figure 4:
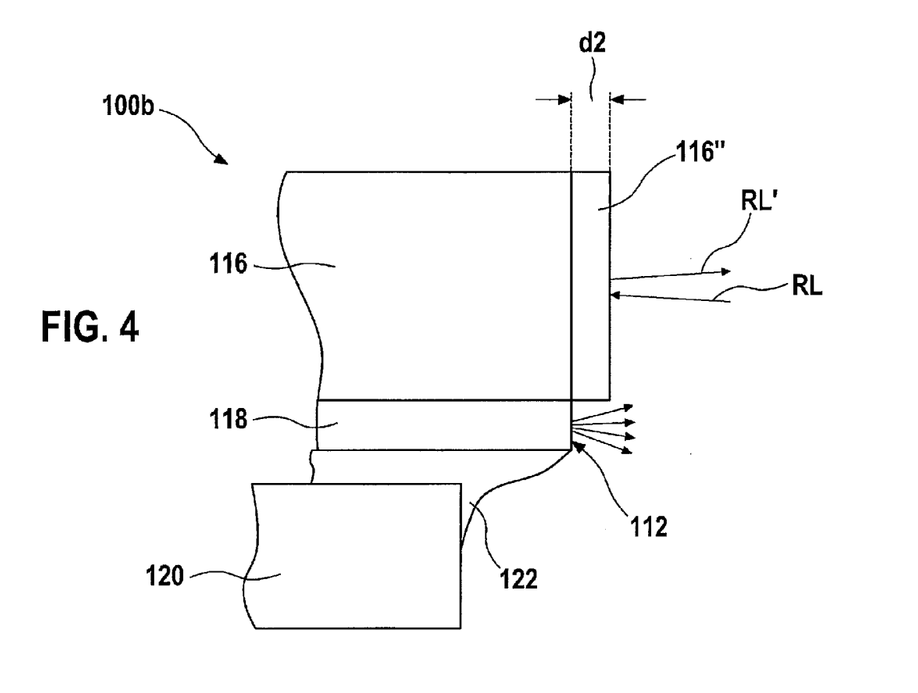

After one further preferred specific embodiment, cf. FIG. 4, semiconductor laser assembly 100b has a metallic reflector layer 116" having an increased layer thickness d2, as compared to the specific embodiment according to FIG. 3. In this specific embodiment, layer thickness d2 advantageously amounts to about 80 nanometers or more. Because of that, besides the efficient reflection of incident radiation RL, at the same time advantageously an optimized heat dissipation via the end face of substrate 116 takes place. In particular, in this way heat energy is able to be dissipated efficiently from the area of exit area 112 of semiconductor laser 110.

Although preferably the end face of substrate 116 has a metallic reflector layer 116', 116" applied to it, the principle of the reflecting layer, according to the present invention, may also be used on other surface areas of semiconductor laser assembly 100, 100a, 100b. In a particularly preferred manner, all surface areas of the semiconductor laser assembly are provided with a reflecting layer according to the present invention which, during the operation of semiconductor laser 110, could be acted upon by undesired radiation energy, whether it be self-generated laser radiation L or externally generated radiation.

Figure 5:
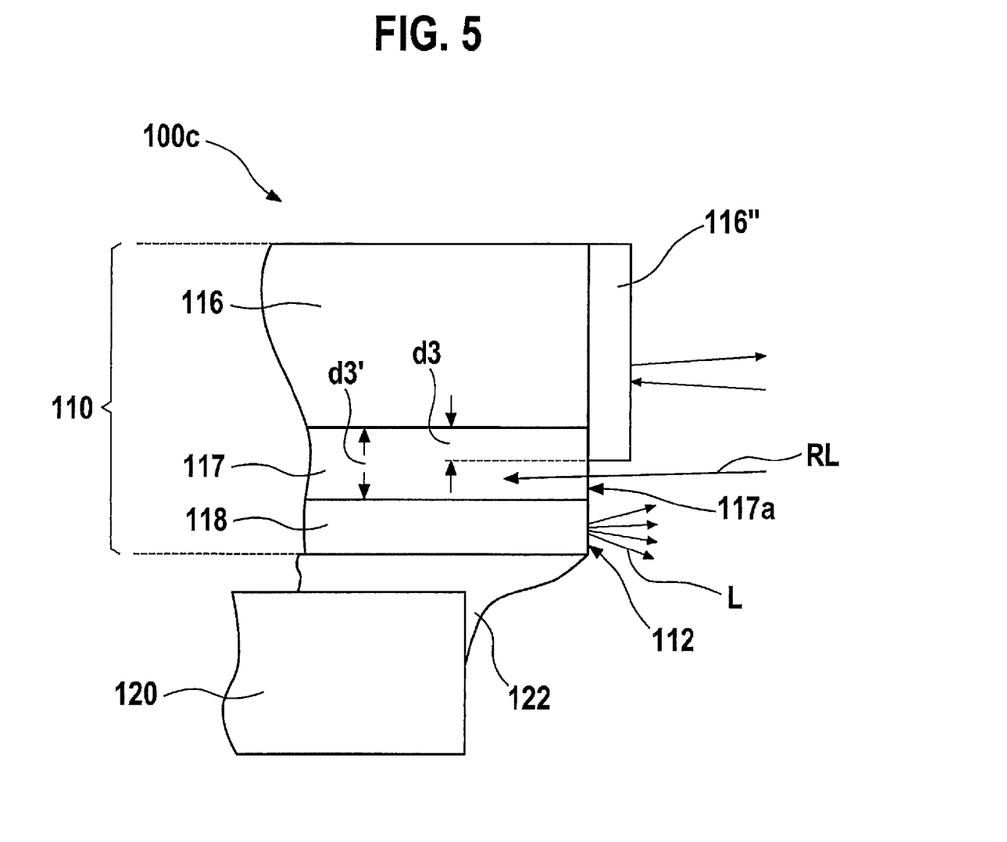

FIG. 5 shows an additional specific embodiment 100c of a semiconductor laser assembly according to the present invention, in which the layer construction of semiconductor laser 110 has an additional layer, namely, intermediate layer 117, compared to specific embodiments described above with reference to FIGS. 2 to 4.

Intermediate layer 117 is situated between laser layer 118 and substrate 116, as may be seen in FIG. 5. In one particularly preferred specific embodiment, intermediate layer 117 is developed to be transparent to wavelengths of undesired incident radiation RL, and especially of laser radiation L generated by semiconductor laser 110. Because of that, it is advantageously avoided that incident radiation RL is absorbed directly in the area of end face 117a and converted to heat, consequently having the effect of a heat input directly in the area of exit area 112 of semiconductor laser 110.

Because of the light-conducting property of intermediate layer 117, it is advantageously ensured that radiation RL that is incident upon end face 117a of intermediate layer 117 is passed on at least partially from the end face end region of intermediate layer 117, so that this proportion of the passed-on radiation is no longer able to contribute to the heating of exit area 112 of semiconductor laser 110.

In addition to the light conducting function of intermediate layer 117, the latter has the further advantage that a low production tolerance in applying reflecting layer 116" onto semiconductor laser assembly 100 has to be maintained. For, the production tolerances for applying reflecting layer 116" may be selected so that reflecting layer 116" overlaps end face 117a of intermediate layer 117 at least partially, in the present case having an overlapping measure d3. This ensures that an end face surface of semiconductor laser assembly 110, that is as large as possible, is acted upon by reflecting layer 116", without there being the simultaneous danger that a proportion of exit area 112 of semiconductor laser 110 is acted upon by reflecting layer 116".

Consequently, intermediate layer 117 is used as a buffer layer, which makes it possible to set lower production tolerances for producing reflecting layer 116".

Intermediate layer 117 preferably has a layer thickness d3', of approximately 0.5 μm to approximately 10 μm.

In order to develop intermediate layer 117 to be transparent to wavelengths of undesired radiation RL, intermediate layer 117 may be developed, for instance, of aluminum gallium arsenide (AlGaAs), an aluminum proportion of approximately 0.3 or more being provided.

As has already been described several times, applying reflecting layer 116" takes place so that a lower end of the reflecting layer 116" in FIG. 5 lies in area 117a of intermediate layer 117.

Especially advantageously, intermediate layer 117, according to an additional specific embodiment, may also be developed as a waveguide layer, whereby an even more efficient conducting on of radiation RL, that is incident upon semiconductor laser assembly 100, comes about, away from a surface area of exit area 112. A waveguide layer may be developed, in a manner known per se, in that intermediate layer 117, on its part, has a layer construction made up of two partial layers, each having a different index of refraction, radiation RL, that is to be guided on, being guided in the partial layer having the higher index of refraction. The layer construction of intermediate layer 117 may also advantageously be developed so that the latter, together with laser layer 118 implements the wave guide effect described for undesired radiation RL, radiation RL therefore, because of layer construction 117, 118 being guided away from exit area 112, i.e. into regions of semiconductor laser assembly 100, that are farther inside.

Figures 6A, 6B:
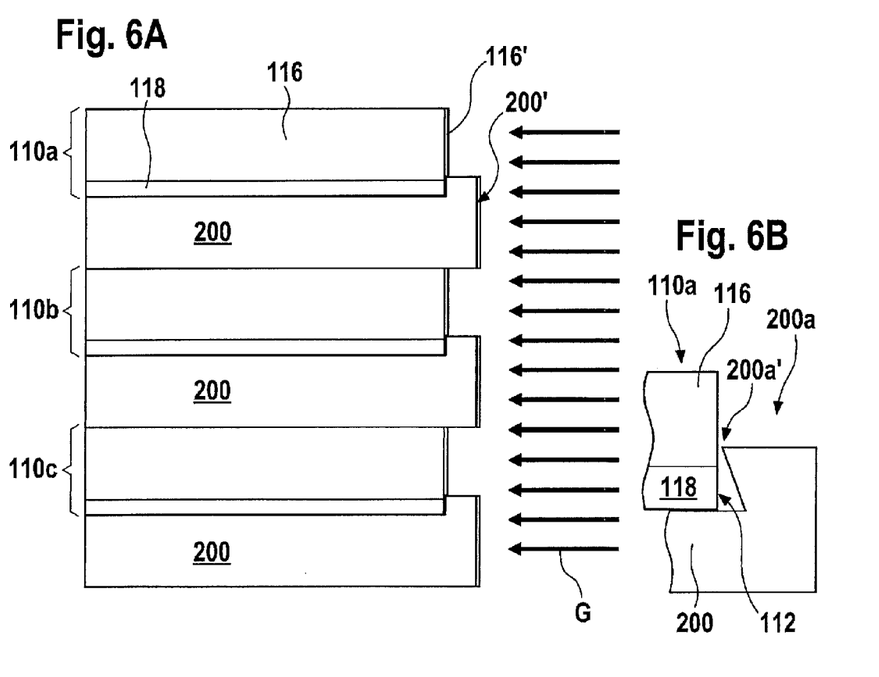

FIG. 6a shows schematically a side view of an arrangement of a plurality of semiconductor lasers 110a, 110b, 110c, as it comes about during one specific embodiment of the production method according to the present invention. To apply reflecting layer 116', in the present case a gold reflector layer, the plurality of semiconductor lasers 110a, 110b, 110c are stacked over one another as may be seen in FIG. 6a, each semiconductor laser 110a, 110b, 110c being situated on a carrier element 200 which, in the present case is essentially tub-shaped or L-shaped.

The leg of carrier element 200, extending vertically upwards in FIG. 6a, situated in FIG. 6a in the right end region of carrier element 200, advantageously implements a protective mask for the exit area, not designated in greater detail in FIG. 6a, of laser layer 118 of semiconductor lasers 110a, 110b, 110c. Because of this, during a sputtering process for applying gold reflector layer 116', no gold ions are able to be deposited directly onto exit area 112 of laser layer 118. Gold ions G, that originate from a suitable material source, besides on the actually to be coated surface area 114a (FIG. 2) of substrate 116, rather deposit on right end face 200', in FIG. 6a, of carrier element 200.

Carrier elements 200 may be used a plurality of times, and are used after the application of reflector layer 116' onto semiconductor lasers 110a, 110b, 110c, separated from them again. Thereafter, semiconductor lasers 110a, 110b, 110c may be installed in a target system.

FIG. 6b schematically shows a right end region, in FIG. 6a, of carrier elements 200. The leg of carrier element 200, lying in end region 200a, extending vertically upwards in FIG. 6b, preferably has an undercut 200a', which is developed so that, in response to the joining together of semiconductor laser 110a with carrier element 200, leg 200a of the carrier element does not come into contact with exit area 112 of laser layer 118. Leg 200a of carrier element 200 should accordingly be designed to be long. While using the configuration imaged in FIG. 6b, a semiconductor laser 110a for the process step of sputtering may advantageously be positioned precisely on carrier element 200, without damaging exit area 112 for laser radiation L being damaged.

Figure 7:
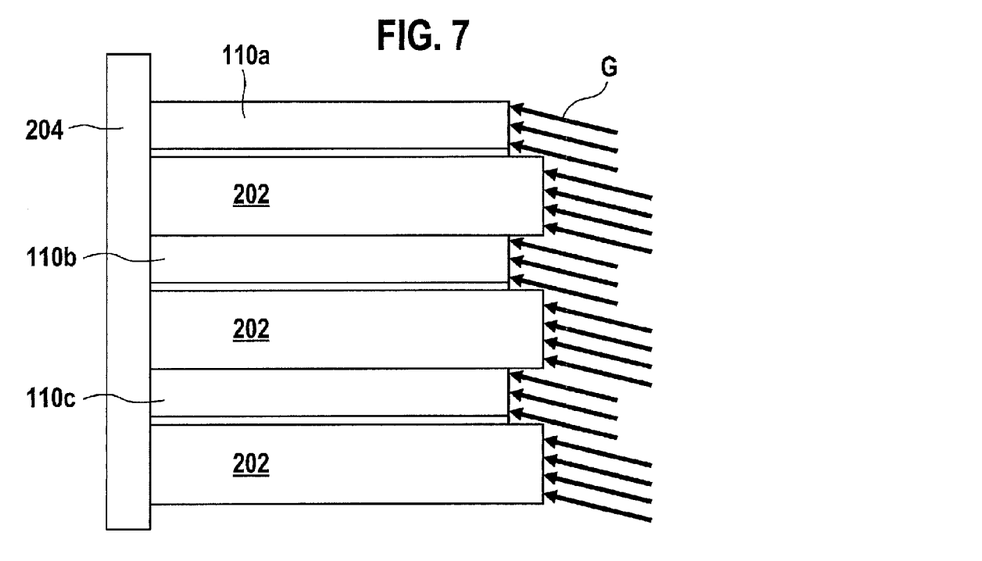
FIG. 7 shows schematically a side view of a configuration of a plurality of semiconductor lasers, during a production step according to a further specific embodiment of the method according to the present invention.

FIG. 7 shows an additional configuration, that may occur in the production method during the step of producing the metallic reflector layer 116', 116".

Semiconductor lasers 110a, 110b, 110c, together with presently approximately cubically developed carrier elements 202, are fastened to a stop 204 situated at the left in FIG. 7. The dimensions of carrier elements 202 are adjusted in such a way to the dimensions of semiconductor lasers 110a, 110b, 110c, that in response to an acting upon with gold ions G taking place at a nonhorizontal angle, exit areas 112 of individual semiconductor lasers 110a, 110b, 110c are advantageously shaded by corresponding corners of carrier elements 202, so that, in turn, each exit area 112 is protected from a direct action upon it using gold ions G.

Figure 8:
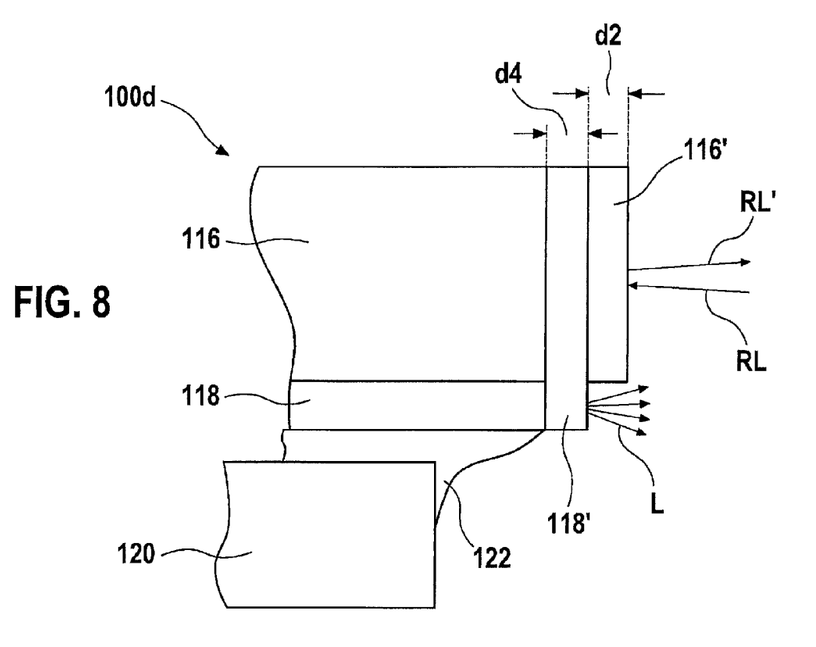
FIG. 8 shows schematically, a side view of a further specific embodiment of a semiconductor laser assembly according to the present invention.

FIG. 8 shows schematically a side view of an additional specific embodiment 100d of the semiconductor laser assembly according to the present invention.

In addition to reflector layer 116' according to the present invention, a dielectric coupling out layer 118' is provided having a layer thickness d4. Decoupling layer 118' makes possible the efficient coupling out of laser radiation L from laser layer 118, and, from a production point of view, is preferably applied over the entire surface of the end face as well of laser layer 118 as of substrate 116. Metal reflector layer 116', according to the present invention, is applied onto dielectric layer 118' in the preferred specific embodiment shown in FIG. 8.

Specific embodiments are also conceivable in which reflector layer 116' is first applied onto the end face areas of semiconductor laser assembly 100d, and in which only after that a dielectric layer 118' is applied onto the end faces of components 116, 118.

Besides the development of reflecting layer 116', 116" as metallic reflector layers, a dielectric reflector layer may also be provided. For instance, the dielectric reflector layer may have one or more Bragg mirrors made of the materials SiOx, SiNx, TiOx or a combination of these. The Bragg mirrors are designed, in a manner known per se, for the wavelengths of radiation RL that is to be reflected.

By applying the principle according to the present invention, the coupling in of undesired radiation to semiconductor laser assembly 100 may generally be prevented, so that less heating comes about, particularly of exit area 112 of semiconductor laser 110. This advantageously lowers the risk of thermal defects in the area of exit area 112.

In one preferred specific embodiment of the present invention, it may be provided that the band gap of substrate 116 of semiconductor laser assembly 100 is of such a nature that laser radiation L, RL is absorbed in substrate 116, in particular the wavelength corresponding to the band gap being greater than the wavelength of laser radiation L, RL. In an especially preferred manner, it may be provided that GaAs be used as substrate 116, in particular, the wavelength of laser radiation L, RL being less than 870 nm or lying in the range of 808 nm.

In a further advantageous specific embodiment, it may be provided that metallic reflector layer 116' (FIG. 2) has a micropatterned surface in such a way that it reflects incident radiation RL regularly or irregularly into as different as possible spatial directions, whereby advantageously multiple reflections between semiconductor laser assembly 100 and other objects 400 (FIG. 1), that are provided in the surrounding areas of semiconductor laser assembly 100, are avoided.

The micropatterning of reflecting layer 116' may, for instance, take place by applying additional gold atoms, in the course of a galvanic process, to a reflector layer 116 of gold, first produced using sputtering. Micropatterning is also conceivable, in a manner known per se, by applying lasers or other known processing techniques.

In one additional specific embodiment 100e (FIG. 9), it is provided that at least one reflecting area of the semiconductor laser assembly is formed by having one reflector element 130 be provided on semiconductor laser assembly 100e.

Alternatively or supplementarily to the application of a reflecting layer 116', 116" (FIGS. 3, 4), for instance, by sputtering directly onto a surface 114a of the semiconductor laser assembly, a reflecting surface area is also able to be implemented.

Figure 9:
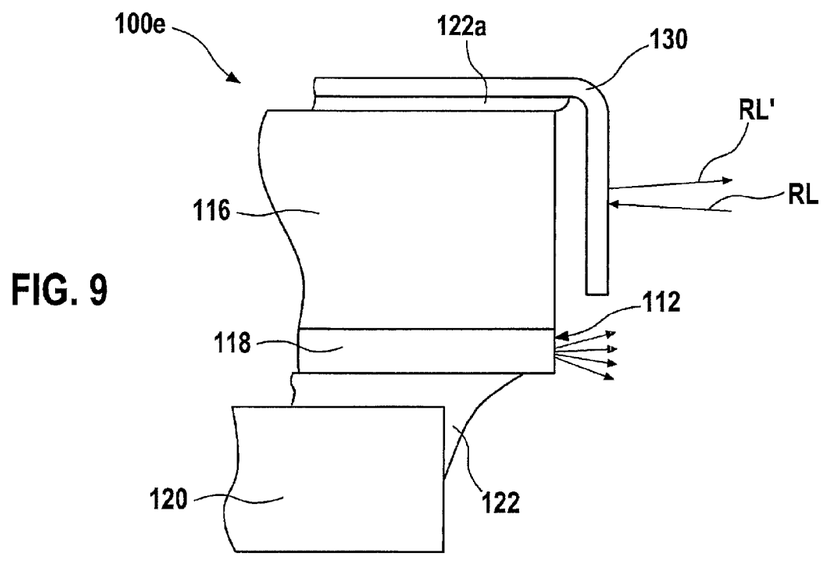
FIG. 9 shows schematically, a side view of a further specific embodiment of a semiconductor laser assembly according to the present invention.

Reflector element 130 may, for instance, be a metal foil or another type of formable article made of metal or having a material that reflects well the undesired radiation, and is situated on semiconductor laser assembly 100e and connected to it in such a way that semiconductor laser assembly 100e is protected from undesired radiation RL, following the principle according to the present invention. Consequently, reflector element 130 is used, so to speak, to shade semiconductor laser assembly 100e from undesired radiation RL.

In the specific embodiment according to FIG. 9, reflector element 130 has a geometry that is essentially L-shaped, it being situated with a first leg essentially parallel to a surface of substrate 116 that is horizontal in FIG. 9, and is connected to it in continuous material via a solder layer 122a. The second leg of reflector element 130, as may be seen in FIG. 9, is situated so that it covers a substantial part of the end face of substrate 116, on the right in FIG. 9, and, with that, protects from undesired irradiation RL, cf. reflected radiation RL'.

Reflector element 130 may advantageously be used alternatively or supplementarily to previously described reflector layers 116', 116", and also be provided with a micropatterned surface, in order to scatter incident radiation RL as well as possible.

Alternatively or supplementarily to reflector element 130, a shading element may also be provided which corresponds in shape and situation approximately to reflector element 130, but does not necessarily have a reflecting surface to reflect radiation RL. Such a shading element may also essentially absorb radiation RL and dissipate heat created in the process via the contact to solder layer 122a. In this way, an effective protection of semiconductor laser assembly 100 from radiation RL is also yielded, because radiation RL, based on the shading element, is not able to strike directly a surface of semiconductor laser assembly 100 or of semiconductor laser 110.

Figure 10:
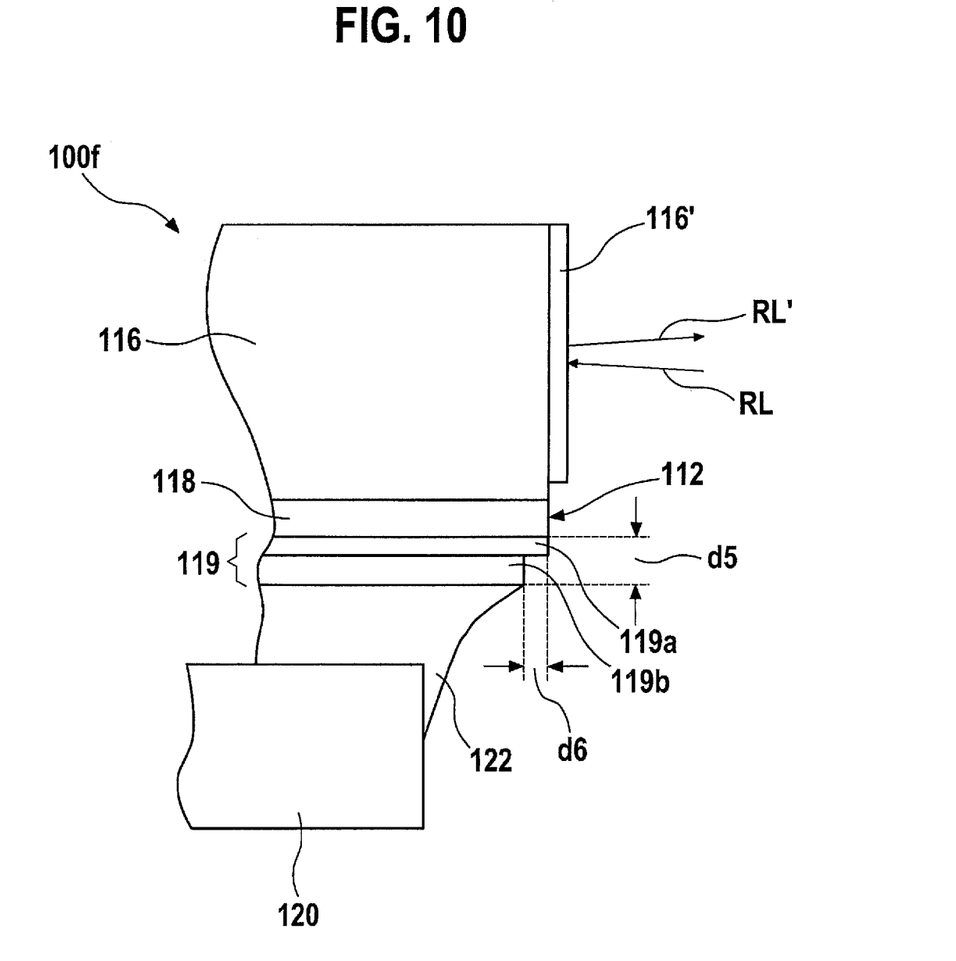
FIG. 10 shows schematically, a side view of a still further specific embodiment of a semiconductor laser assembly according to the present invention.

FIG. 10 shows a further specific embodiment 100f according to the present invention, in which a metallization 119 has been applied to laser layer 118, in order to enable a continuous material connection to solder layer 122. A vertical layer thickness of this metallization layer 119 indicated in FIG. 10 by a vertical double arrow, is preferably designed to be relatively large, in order to contribute to an efficient heat dissipation from the area of exit area 112. Layer thickness d5 of metallization layer 119, according to one advantageous specific embodiment, amounts approximately to between 0.1 µm and about 3.0 µm, especially between about 0.3 µm and about 2.0 µm.

In one additional advantageous specific embodiment, it is provided that metallization layer 119, on its part, has a layer structure. A first metallization partial layer 119a is preferably situated over a full surface on laser layer 118. First metallization partial layer 119a preferably extends all the way to exit area 112 of laser layer 118.

A second metallization partial layer 119b is situated between first metallization layer 119a and solder layer 122, and is connected to the latter by continuous material.

Instead of a continuous material connection to solder layer 122, laser layer 118 may generally, that is, also in the case of other aforementioned specific embodiments, be clamped to carrier element 120.

First metallization partial layer 119a preferably has a thickness between about 0.3 µm and about 2 µm.

Second metallization partial layer 119b preferably has a thickness between about 1 µm and about 6 µm.

Second metallization partial layer 119b preferably does not extend all the way to exit area 112 of laser layer 118, but is at a distance to it of d6 of at most about 30 µm or less, in particular less than 10 µm.

Metallization layer 119 according to FIG. 10 makes possible a further improved heat dissipation from the area of exit area 112.

Although FIG. 10 reflects the wetting of layer 119 by solder layer 122 all the way to the right end, in FIG. 10, of partial layer 119b, it is also possible, in additional specific embodiments, to extend solder layer 122 even further in the direction of exit area 112, i.e. to the right in FIG. 10. For example, solder layer 122 may be developed and situated so that it also fully or partially wets the underside of partial layer 119a, and consequently extends farther to the right, by at most distance d6, than shown in FIG. 10.

In still further specific embodiments, in which there is a slight degree of wetting of layer 119 by solder layer 122, the metallization may advantageously have a greater layer thickness, in order to ensure a certain heat dissipation of the area of exit area 112.

What is claimed is:

1. A semiconductor laser assembly, comprising:
   at least one semiconductor laser configured to emit laser radiation through an exit area; and
   at least one further area, different from the exit area, configured to reflect at least one specified wavelength range, in which a reflective surface of the at least one further area is perpendicular to a direction of the emitted laser radiation;
   wherein the at least one further area is a part of at least one of a surface of the semiconductor laser and the semiconductor laser assembly.

2. The semiconductor laser assembly as recited in claim 1, wherein the specified wavelength range is between approximately 800 nanometers and approximately 1080 nanometers.

3. The semiconductor laser assembly as recited in claim 2, wherein the reflectivity of the at least one further area is greater than approximately 90 percent.

4. The semiconductor laser assembly as recited in claim 3, wherein the at least one further area is an area situated adjacent to the exit area.

5. The semiconductor laser assembly as recited in claim 3, wherein the at least one further area is an end face of a substrate layer of the semiconductor laser.

6. The semiconductor laser assembly as recited in claim 4, wherein the at least one further area includes a reflector layer made of at least one of metal and a dielectric material.

7. The semiconductor laser assembly as recited in claim 6, wherein the reflector layer is made of gold and has a thickness greater than approximately 80 nanometers.

8. The semiconductor laser assembly as recited in claim 6, wherein the at least one semiconductor laser includes: a laser layer having at least one active zone; a substrate layer; and an intermediate layer situated between the laser layer and the substrate layer, and wherein at least a portion of the intermediate layer is configured to be transparent to the laser radiation.

9. The semiconductor laser assembly as recited in claim 8, wherein the intermediate layer is configured as a waveguide layer for the laser radiation.

10. The semiconductor laser assembly as recited in claim 4, wherein at least one further area is formed by a reflector element provided on the semiconductor laser.

11. The semiconductor laser assembly as recited in claim 6, wherein the reflector layer has a micropatterned surface.

12. The semiconductor laser assembly as recited in claim 1, wherein the at least one further area is configured to reflect at least one specified wavelength range of the laser radiation.

13. The semiconductor laser assembly as recited in claim 1, wherein the at least one further area is configured to reflect at least one specified wavelength range other than a wavelength range of the laser radiation.

14. A semiconductor laser assembly, comprising:
  at least one semiconductor laser configured to emit laser radiation through an exit area;
  wherein at least one further area different from the exit area is configured to reflect at least one specified wavelength range of the laser radiation, the at least one further area being a part of at least one of a surface of the semiconductor laser and the semiconductor laser assembly, and
  wherein the semiconductor laser is situated on a carrier element with the aid of a solder layer, and wherein a distance of the solder layer from the exit area is less than 10 micrometers.

15. The semiconductor laser assembly as recited in claim 14, wherein the solder layer is developed to provide for maximum wetting of the semiconductor.

16. A method for producing a semiconductor laser assembly having at least one semiconductor laser configured to emit laser radiation through an exit area, comprising:
  providing the at least one semiconductor laser;
  covering the exit area of the at least one semiconductor laser using a protective mask;
  applying a reflector layer onto at least one further area different from the exit area, the reflector layer configured to reflect the laser radiation, wherein the at least one further area is a part of at least one of a surface of the semiconductor laser and the semiconductor laser assembly; and
  removing the protective mask.

17. The method as recited in claim 16, wherein the covering of the exit area is achieved by the at least one semiconductor laser being (i) situated on a carrier element forming the protective mask and (ii) aligned in such a way relative to the carrier element that the exit area is covered by a section of the carrier element.

18. The method as recited in claim 17, wherein the application of the reflector layer takes place using sputtering.

19. The method as recited in claim 17, wherein the section of the carrier element is L-shaped to provide the protective mask for the exit area of the semiconductor laser.

20. A method for producing a semiconductor laser assembly having at least one semiconductor laser configured to emit laser radiation through an exit area, comprising:
  providing the at least one semiconductor laser;
  covering the exit area of the at least one semiconductor laser using a protective mask;
  applying a reflector layer onto at least one further area, different from the exit area, the reflector layer configured to reflect at least one specified wavelength range of the laser radiation, in which a reflective surface of the at least one further area is perpendicular to a direction of the emitted laser radiation, wherein the at least one further area is a part of at least one of a surface of the semiconductor laser and the semiconductor laser assembly; and
  removing the protective mask.

21. A semiconductor laser assembly, comprising:
  at least one semiconductor laser configured to emit laser radiation through an exit area;
  at least one further area, different from the exit area, configured to receive a reflective layer; and
  a protective mask configured to cover the exit area during an application of the reflective layer to the at least one further area;
  wherein the at least one further area is a part of at least one of a surface of the semiconductor laser and the semiconductor laser assembly.

* * * * *